United States Patent [19]

Tawada et al.

[11] Patent Number: 4,825,806
[45] Date of Patent: May 2, 1989

[54] FILM FORMING APPARATUS

[75] Inventors: Yoshihisa Tawada; Kazunori Tsuge, both of Kobe, Japan

[73] Assignee: Kanegafuchi Kagaku Kogyo Kabushiki Kaisha, Osaka, Japan

[21] Appl. No.: 74,594

[22] Filed: Jul. 17, 1987

Related U.S. Application Data

[62] Division of Ser. No. 800,638, Oct. 15, 1985, Pat. No. 4,701,344.

[51] Int. Cl.$^4$ ............................................. C23C 16/00
[52] U.S. Cl. .................................... 118/719; 118/723; 118/725; 118/729
[58] Field of Search ................ 118/719, 723, 725, 729

[56] References Cited

U.S. PATENT DOCUMENTS 4,513,022 4/1985 Jansen et al. .......................... 427/39

Primary Examiner—Bernard Pianalto
Attorney, Agent, or Firm—Armstrong, Nikaido, Marmelstein & Kubovcik

[57] ABSTRACT

A process for forming a film, characterized in that, in forming a film by glow discharge decomposition, one or more electrode pair rows each consisting of a plurality of high frequency electrode pairs are arranged in a line and in parallel and substrates are arranged on both sides of said electrode pair row approximately in parallel to the electrode pair row. According to the process, damage of the film due to plasma can be reduced, a shield on the back of the RF electrode is not needed, and a film of a large area can be obtained.

11 Claims, 3 Drawing Sheets

FILM FORMING APPARATUS

This is a division of application Ser. No. 800,638, filed Oct. 15, 1985, now U.S. Pat. No. 4,701,344.

TECHNICAL FIELD

The present invention relates to a process for forming semiconductor film and an apparatus used therefor.

BACKGROUND ART

Heretofore, glow discharge decomposers used for the production of solar cells and the like have been mostly employed in the form of an apparatus based on a parallel-plate method shown in FIG. 4. The parallel-plate method is suitable for the formation of films of large area but has a disadvantage in that an electric discharge taking place between an RF electrode 6 and an opposite electrode 7 results in the plasma damaging of a thin film formed on a substrate 3 placed on the RF electrode or the opposite electrode (ground electrode). Moreover, since an electric discharge also takes place on the back of the RF electrode 6 forming the RF electrode pair, it is necessary to provide a shield for suppressing this discharge. However, the provision of such a shield has the disadvantage of making the discharge unstable.

Hamakawa et al. proposed a transverse plasma method (Japanese Examined Patent Publication (Tokkyo Kokoku) No. 42126/1983), as shown in FIG. 5, to minimize damage caused by plasma to thin films formed. However, there is naturally a limit to the distance between the RF electrode 6 and the ground electrode 7, and hence to the size of the substrate 3 to be used, which results in a disadvantage that it is impossible to obtain a thin film of large area. Moreover, in order to avoid deposition of a thin film on the electrode pair, a container such as one designated by the numeral 4 is required.

In view of the actual circumstances described above, the present inventors have conducted intensive research to minimize damage caused by plasma to a thin film formed on the substrate in the parallel-plate method and to dispense with the shield required on the back of the RF electrode and the container used in the transverse plasma method while forming a thin film of large area, and have found out that the object can be attained by the present invention, and then have completed the present invention.

DISCLOSURE OF THE INVENTION

Namely, the present invention relates to a process for forming a film, characterized in that, in forming a thin film of amorphous semiconductor or the like by the glow discharge decomposition, one or more electrode pair rows each consisting of a plurality of high frequency electrode pairs arranged in a line are arranged in parallel and substrates are arranged on both sides of the electrode pair row approximately in parallel to the electrode pair row, and relates to a glow discharge decomposition film forming apparatus, characterized by comprising one row or parallel rows each consisting of a plurality of high frequency electrode pairs arranged in a line, substrate moving devices disposed on both sides of the electrode pair row to arrange substrates aproximately in parallel to the electrode pair row, and, if necessary, a heater positioned to heat the substrate.

BEST MODE OF THE INVENTION

Figure 1:
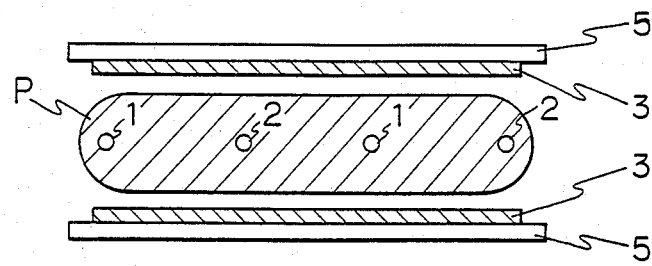
FIG. 1 is an explanatory view showing an embodiment of the apparatus of the present invention.

The process of the present invention is described with reference to FIG. 1 showing an embodiment of the apparatus of the invention in the following.

Figure 2:
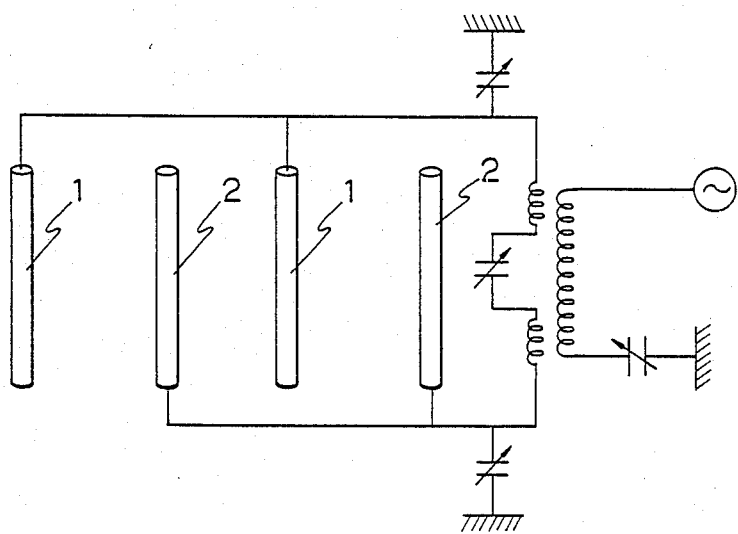
FIG. 2 is an explanatory view showing an embodiment of the high frequency electrode pair row used in the apparatus of the present invention.
Figure 3:
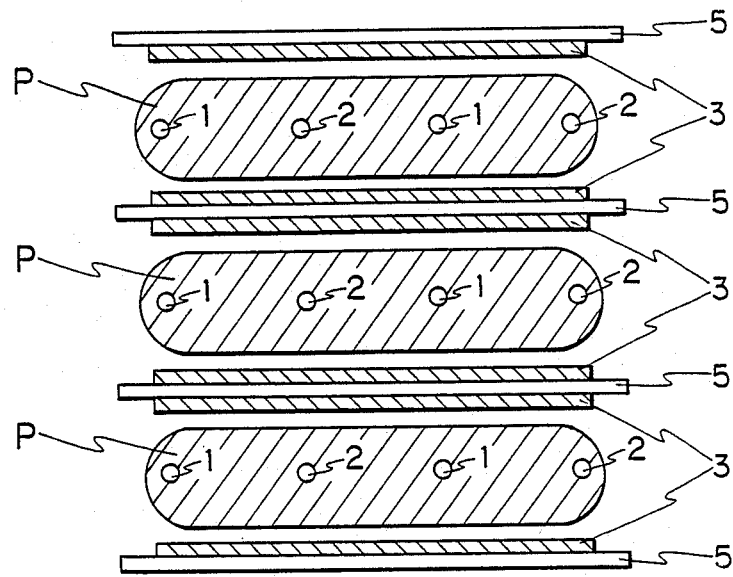
FIG. 3 is an explanatory view showing another embodiment of the apparatus of the present invention.
Figure 4:
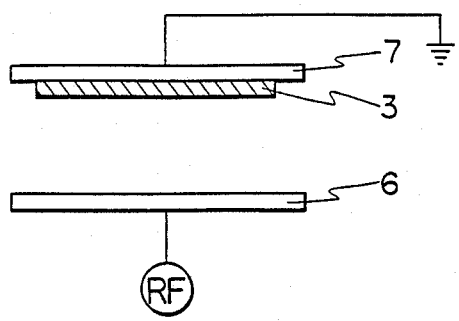
FIGS. 4 and 5 are explanatory views of film forming apparatuses conventionally used.
Figure 5:
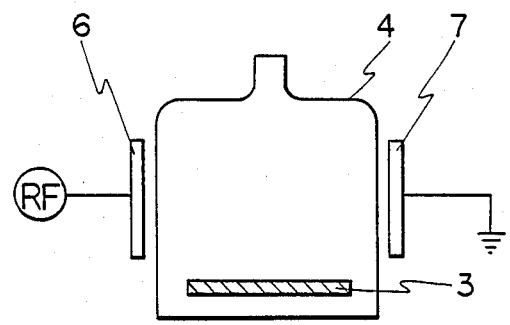

As shown in FIG. 1, high frequency electrodes 1 and 2 are linearly and alternately arranged in a plurality of pairs, so that electric discharge takes place between the electrodes 1 and 2. The electrodes may be planar, but in order to prevent abnormal discharge and to produce uniform plasma P, it is preferable that the electrodes have round cross-section, e.g., circular or oval. Such a construction makes unnecessary the shield on the back which is required in the case of planar electrodes. The distance between the electrodes is preferably about 5 to 50 cm from the standpoint of stability and uniformity of discharge, more preferably about 10 to 40 cm. Only a pair of electrodes 1 and 2 may be provided or, as shown in FIG. 1, a number of pairs may be arranged in a line, the area of the film to be formed can be increased, theoretically to infinitude. On the other hand, with the parallel-plate method, the maximum area of electrode is limited to about 1 m$^2$. As shown in FIG. 3, if a plurality of rows each consisting of a number of the electrode pairs arranged in a line are arranged in parallel, the film forming rate can be increased. In addition, a concrete example in which the high frequency electrode pairs are arranged is shown in FIG. 2.

On both sides of the electrode pair row are substrate moving devices (not shown) for moving the substrates 3 in parallel to the electrode pair row. The substrate moving device may have a function so as to carry the substrate 3 to the electrode pair section, and then to move them after the film formation. However, it is preferable that while maintaining the distance between the substrate and the electrode pair row approximately constant during film formation, the substrate is subjected to movement in one direction or to repetitive amplitude-movement (preferable amplitude being at least ¼ of the distance between the electrode pairs). If the substrate is moved during film formation in this manner, the variations in the thickness of the film formed can be minimized. For continuous formation of films by using a long continuous substrate, the method of moving the substrate in one direction is suitable, while for batch-wise film formation by using a short substrate, the method of repetitively amplitude-moving the substrate is suitable. A short substrate may, of course, be continuously moved. In the conventional manner, if the substrate deviates from the discharge section, matching would be out of order, which requires a special provision. According to the process of the present invention, electric discharge is stabilized even if the substrate is deviated from the discharge section, because no discharge takes place through the substrate.

A heater 5 which is provided according to the requirement to heat the substrate 3 may be used to heat the substrate 3. The temperature of the substrate varies depending on the type of films to be formed and the purpose of use, and usually is preferably about 50° to 400° C.

The above-mentioned apparatus of the present invention and shown in FIG. 1 is installed in a glow discharge decomposition film forming apparatus for preparing an amorphous semiconductor film or the like. When forming a film of about 0.01 to 100 μm in thickness, there are employed a frequency of about 1 KHz to 100 MHz, and an RF power per unit area of film of 0.01 to 10 W/cm$^2$, when microcrystallizing, about 1 to 100 W/cm$^2$, in the presence of about 0.01 to 5 Torr of raw material gas comprising a reactive gas such as a silicon compound, a carbon compound, a nitrogen compound, a doping gas or an inert gas.

One of the high frequency electrodes 1 and 2 may be grounded, but none of them may be grounded so that they are not distinguished from each other as to which is plus or minus (floated). In the case where the high frequency electrodes 1 and 2 are floated, there are advantages in that the plasma is uniform and less discharge takes place between the substrate and an inner wall of the apparatus.

The row of high frequency electrodes 1 and 2 and the substrates 3 transferred on both sides thereof may, if approximately parallel, be horizontal, vertical or inclined at any angle. In case of a substantially vertical arrangement, a good film is formed since there is no possibility of dust falling onto the film formed.

There are no particular limitation with respect to the apparatus for forming an amorphous semiconductor film or the like having the apparatus of the present invention installed therein. Thus, any type of film forming apparatus which is usually used may be employed. For example, the apparatus may be of multi-chamber construction. In such a case the apparatus of the present invention may be installed in at least one of the chambers constructing the multi-chamber construction (for instance, one of the chambers forming a p-layer, an i-layer or an n-layer). In the case where the apparatus of the multi-chamber construction is used, each partition wall is provided with a slit and a gate valve to allow the substrate to pass through the individual chambers. However, it is preferable from the standpoint of increased productivity that the slit and a differential exhaust chamber instead of the gate valve are provided to allow continuous movement.

The production of a film according to the process of the present invention by using the apparatus device of the invention has characteristics such that less damage is caused by plasma, a film of high quality is formed at a high rate, less powder is formed, and a film having fewer pinholes can be formed since parasitic discharge is less generated, a film of large area can be easily formed, and a decomposition product is effectively deposited on the substrate. Furthermore, in the case of such elements and devices as solar cells of silicon-containing pin, pn, hetero- or homo-type, sensors, IFT (thin film transistor), and CCD (charge coupled device). Particularly in the case of amorphous silicon-containing solar cells, a film of large area having a conversion efficiency of not less than 10% is obtained according to the present invention because the efficiency of such device is greatly influenced by plasma damage. Further, the film prepared according to the present invention can also be satisfactorily applicable to electronic photographic light-sensitive materials, LSI passivation films and printed circuit board insulation films.

The present invention is explained by means of Examples.

EXAMPLE 1

In the arrangement of FIG. 1, electrodes (10 mm in diameter and 500 mm in length) were arranged at intervals of 150 mm, and RF was introduced into the electrodes through a 13.56 MHz RF oscillator and the matching circuit shown in FIG. 2. By using ITO/SnO$_2$ glass substrates of 40 cm square having a temperature of 200° C., there were formed an 100 Å thick p-layer from SiH$_4$/CH$_4$=50/50 and B$_2$H$_6$/SiH$_4$+CH$_4$)=0.05% (% by mole, hereinafter the same, a 6000 Å thick i-layer from SiH$_4$ and a 500 Å thick n-layer from PH$_3$/SiH$_4$=0.2%. Subsequently, an Al layer of about 1000 Å in thickness was formed by vapor deposition. As a result of testing the distribution of conversion efficiency of the solar cell by using an AM-1 100 mW/cm$^2$ solar simulator, the minimum conversion efficiency was 10.4 %, the maximum was 11.7 % and the average was 11 %, which proved that the solar cell was very uniform and had a high efficiency. Further, even if films were formed at a growth rate of 20 Å/sec, the efficiency of the cell obtained was not almost changed.

EXAMPLE 2

In the arrangement of FIG. 3, electrodes (10 mm in diameter and 500 mm in length) were arranged at intervals of 150 mm, and RF was introduced into the electrodes through a 13.56 MHz RF oscillator and three matching circuits shown in FIG. 2. The RF power was 120 W. By using ITO/SnO$_2$ glass substrates of 40 cm square having a temperature of 200° C., there were formed an 100 Å thick p-layer under the conditions of 150 sccm of SiH$_4$, 150 sccm of CH$_4$, and 150 sccm of B$_2$H$_6$ diluted with H$_2$ to 1000 ppm, a 6000 Å thick i-layer under the conditions of 240 sccm of SiH$_4$, and a 500 Å thick n-layer under the conditions of 150 sccm of SiH$_4$ and 300 sccm of PH$_3$ diluted with H$_2$ to 1000 ppm. subsequently, an Al layer of about 1000 Å was formed by vapor deposition. As a result of testing the distribution of conversion efficiency of the solar cell by using an AM-1 100 mW/cm$^2$ solar simulator, the minimum conductive efficiency was 10.1%, the maximum was 11.9% and the average was 10.8%, which proved that the solar cell was very uniform and had a high efficiency.

We claim:

1. An apparatus for forming a film by glow discharge, comprising:
   (a) a chamber;
   (b) at least one row of electrode pairs provided in said chamber, each row consisting of a plurality of high frequency electrodes arranged in a single straight line, said rows being parallel to each other and being arranged so that electric discharge occurs only between electrodes in the same row, but no electric discharge occurs between electrodes from different rows;
   (c) a substrate moving device disposed on each side of each row of electrode pairs and approximately in parallel to said row, wherein each substrate moving device is disposed to move a planar substrate between two rows of electrode pairs so that the substrate does not pass through any line of electric discharge between the electrodes;

(d) means for providing at least one raw material gas for glow discharge in said chamber; and (e) means for applying a high-frequency potential to said electrodes.

2. The apparatus of claim 1, wherein said substrate moving device is adapted to move a substrate while the distance between the substrate and the electrode a pair row is maintained at an approximately constant value.

3. The apparatus of claim 2, wherein the movement is a repetitive amplitude movement.

4. The apparatus of claim 3, wherein the amplitude of said amplitude movement is at least ¼ of the distance between electrode pairs.

5. The apparatus of claim 2, wherein the movement is a movement in one direction.

6. The apparatus of claims 1, 2, 3, 4 or 5, wherein the high frequency electrodes are floated electrodes which are not distinguishable from each other as to which is positive or negative.

7. The apparatus of claim 6, wherein the high frequency electrodes are circular or oval in cross section.

8. The apparatus of claim 7, wherein the frequency of the high frequency wave in said high frequency electrodes is 1 KHz to 100 MHz.

9. The apparatus of claim 1, which comprises a heater for heating the substrate.

10. The apparatus of claim 1, wherein the film forming apparatus has a multi-chamber construction.

11. The apparatus of claim 10, wherein the multi-chamber construction is a construction in which the chambers are partitioned by partition walls each having a slit and the partitioned chambers are differentially exhausted.

* * * * *